United States Patent
Matsui et al.

(10) Patent No.: US 6,916,981 B2
(45) Date of Patent: Jul. 12, 2005

(54) SEMICONDUCTOR LAYER, SOLAR CELL USING IT, AND PRODUCTION METHODS AND APPLICATIONS THEREOF

(75) Inventors: Fumio Matsui, Okayama (JP); Hirofumi Mitekura, Okayama (JP); Kentaro Yano, Okayama (JP); Toshiki Koyama, Nagano (JP); Yoshio Taniguchi, Nagano (JP)

(73) Assignee: Kabushiki Kaisha Hayashibara Seibutsu Kagaku Kenkyujo, Okayama (JP)

(*) Notice: Subject to any disclaimer, the term of this patent is extended or adjusted under 35 U.S.C. 154(b) by 182 days.

(21) Appl. No.: 10/257,600

(22) PCT Filed: Mar. 22, 2001

(86) PCT No.: PCT/JP01/02270

§ 371 (c)(1),
(2), (4) Date: Oct. 15, 2002

(87) PCT Pub. No.: WO01/80346

PCT Pub. Date: Oct. 24, 2001

(65) Prior Publication Data

US 2003/0155583 A1 Aug. 21, 2003

(30) Foreign Application Priority Data

Apr. 12, 2000 (JP) .................................... 2000-111331
Aug. 17, 2000 (JP) .................................... 2000-247635

(51) Int. Cl.$^7$ .................... H01M 14/00; H01L 31/04

(52) U.S. Cl. ............... 136/250; 136/263; 136/252; 136/256; 257/43; 257/431; 438/63; 438/85

(58) Field of Search ................. 136/250, 263, 136/252, 256; 257/43, 431; 438/63, 85

(56) References Cited

U.S. PATENT DOCUMENTS

| | | | | |
|---|---|---|---|---|
| 5,720,827 A | * | 2/1998 | Simmons | 136/250 |
| 5,838,483 A | * | 11/1998 | Teowee et al. | 359/265 |
| 6,150,605 A | * | 11/2000 | Han | 136/263 |
| 2004/0074531 A1 | * | 4/2004 | Matsui et al. | 136/244 |

FOREIGN PATENT DOCUMENTS

| | | |
|---|---|---|
| EP | 0 892 411 A2 | 1/1999 |
| EP | 0 901 175 A2 | 3/1999 |
| EP | 1 088 257 A1 | 3/2000 |
| EP | 1 107 333 A2 | 6/2001 |
| JP | 10-255863 A * | 9/1998 |
| JP | 2000-106222 A * | 4/2000 |
| WO | WO 00/61687 A1 | 3/2000 |

OTHER PUBLICATIONS esp@cenet database: Abstract for JP 2001–93591, Toshiba Corporation (Apr. 6, 2001).

esp@cenet database: Abstract for JP 2001–76772, Toyota Central Research and Development Laboratories, Inc. (Mar. 23, 2001).

esp@cenet database: Abstract for JP 10–255863, Central Research Institute of Electric Power IND. (Sep. 25, 1998).

(Continued)

*Primary Examiner*—Alan Diamond
(74) *Attorney, Agent, or Firm*—Browdy and Neimark, P.L.L.C.

(57) ABSTRACT

The objects of the present invention are to provide semiconductor layers for obtaining solar cells having a relatively high energy conversion efficiency, solar cells using the same, and their production methods and uses; all of which are solved by providing semiconductor layers that are used in solar cells and constructed by semiconductor particle groups having a plurality of peaks in particle size distribution, solar cells using the same, and their production methods and uses.

15 Claims, 2 Drawing Sheets

OTHER PUBLICATIONS esp@cenet database: Abstract for JP 2000–82307, Sony Corporation (Mar. 21, 2000).

esp@cenet database: Abstract for JP 11–103538, My Way Giken K.K. (Apr. 13, 1999).

esp@cenet database: Abstract for JP 11–126917, Fuji Photo Film Co., Ltd. (May 11, 1999).

* cited by examiner

Cristal Size Ca.12nm, 20KV, ×150K normal

200nm

Cristal Size Ca.23nm, 20KV, ×150K    200nm

SEMICONDUCTOR LAYER, SOLAR CELL USING IT, AND PRODUCTION METHODS AND APPLICATIONS THEREOF

TECHNICAL FIELD

The present invention relates to novel semiconductor layers, solar cells using the same, and their production methods and uses, more particularly, to semiconductor layers, which are used in solar cells and constructed by semiconductor particle groups having a plurality of peaks in particle size distribution, solar cells using the same, and their production methods and uses.

BACKGROUND ART

Development of solar cells has been being made energetically in view of various aspects aiming at the improvement in light energy conversion efficiency, durability, operation stability, production easiness, or reduction of production cost. Particularly, since semiconductor layers, which can be said the heart part of solar cells, influence on the light energy conversion efficiency greatly, their materials and structures have been eagerly studied. For example, as materials for composing semiconductor layers, research and development have been made on materials such as IV group semiconductors, compound semiconductors, organic semiconductors, and oxide semiconductors, some of which have already been in practical use. However, the light energy conversion efficiency of conventional solar cells is still not satisfactory, solar cells having a higher light energy conversion efficiency have been in great demand.

The first object of the present invention is to provide a semiconductor layer used in solar cells having an excellent light energy conversion efficiency.

The second object of the present invention is to provide a method for producing the above semiconductor layer.

The third object of the present invention is to provide a solar cell having an excellent light energy conversion efficiency using the above semiconductor layer.

The fourth object of the present invention is to provide a method for producing the above solar cell.

The fifth object of the present invention is to provide uses of the above solar cell.

DISCLOSURE OF INVENTION

To solve the above objects, the present inventors studied specifically on the relationship between the mean particle size of semiconductor particle groups, which are composed of semiconductor layers used in solar cells, and the light energy conversion efficiency of the semiconductor particle groups. As a result, they found that semiconductor layers, which comprise semiconductor particle groups having a plurality of peaks in particle size distribution, and solar cells using the semiconductor layers solve the above-mentioned first and third objects. Also the present inventors solved the above-mentioned second and fourth objects by establishing solar cells using the semiconductor layers, and production methods for the semiconductor layers and solar cells. Moreover, the present inventors solved the above-mentioned fifth object by establishing the uses of the solar cells.

Figure 1:
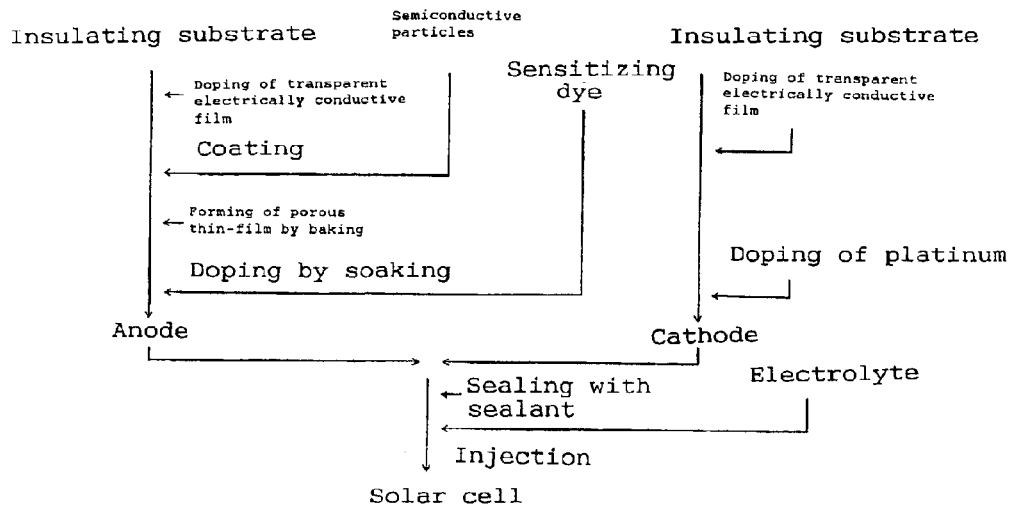
FIG. 1 is a brief drawing of the production steps of a preferred embodiment of solar cell according to the present invention.

EXPLANATION OF SYMBOLS 1,6: Glass substrate
2,2': Transparent electrode
3: Semiconductor layer
4: Electrolyte
5: Platinum electrode
7,7': Sealant

BEST MODE FOR CARRYING OUT THE INVENTION

Conventionally, a semiconductor layer comprising a semiconductor particle group is constructed by a semiconductor particle group, a unit of semiconductor particles, which has a roughly homogeneous particle size and a particle size distribution of a single peak, i.e., a normal distribution or its similar single peak. While the semiconductor layer of the present invention is characteristic in that it comprises semiconductor particle groups (hereafter, the term "semiconductor particle groups" may be merely called "semiconductor particles", unless specified otherwise), having a plurality of peaks in particle size distribution. The solar cell of the present invention has a character that it comprises the above semiconductor layer. The semiconductor layer of the present invention comprises the semiconductor particles having a plurality of peaks in particle size distribution, more particularly, the semiconductor particles which comprise the first semiconductor particles and the second semiconductor particles, where the mean particle sizes of which are different each other. The first- and the second-semiconductor particles usually have a mean particle size of 100 nm or lower. As the first semiconductor particles, those having a mean particle size smaller than that of the second semiconductor particles are preferably selected. More particularly, the mean particle size of the first semiconductor particles is desirably in the range of 9 to 15 nm (12±3 nm), more preferably, those in the range of 10 to 14 nm can be suitably used. While the mean particle size of the second semiconductor particles is desirably in the range of 19 to 27 nm (23±4 nm), more preferably, those in the range of 21 to 25 nm can be suitably used. When the semiconductor layer of the present invention comprises the above first- and second-semiconductor particles, the semiconductor layer will be constructed by semiconductor particles having at least two peaks in particle size distribution. Moreover, for example, in preparing the semiconductor layer of the present invention, the third semiconductor particles having a mean particle size different from those of the first- and the second-semiconductor particles can be used in combination with the first- and the second- semiconductor particles, whereby the semiconductor layer of the present invention is constructed by the semiconductor particles having at least three different peaks in particle size distribution. In addition to the above third semiconductor particles, the use of the fourth semiconductor particles enables to compose the semiconductor layer of the present invention, which have at least four different peaks in particle size distribution. Although the following combination does not exceed the effect attained by the combination use of the above semiconductor particles having a mean particle size in the above range, the combination of semiconductor particles, which have a ratio of the mean particle size of the first semiconductor particles to that of the second semiconductor particles being in the range of about 0.3 to about 0.8 and which have a mean particle size different from the mean particle size of the above-identified range, can also provide semiconductor layers having a relatively high light energy conversion efficiency. As for the ratio of the first- and the second-semiconductor particles, the second semiconductor particles are mixed in an amount of at least ⅔ time by weight of the first semiconductor particles. Preferably, the ratio of the first semiconductor particles to the second semiconductor particles (=(first semiconductor particles):(second semiconductor particles), by weight ratio) is desirably in the range of 3:2 to 1:4, more preferably, in the range of 1:1 to 1:4. Moreover, when one or more other semiconductor particles, which are different from the first- and the second-semiconductor particles with respect to their mean particle sizes, are used together with the first- and the second-semiconductor particles, another semiconductor particles can be appropriately incorporated in an amount within the range that does not hinder the object of the present invention.

As long as the semiconductor particles used in the present invention are those which have the mean particle size of the above-mentioned range, they should not be limited to specific materials and production methods; semiconductor particles which comprise one or more materials selected from $TiO_2$, $Nb_2O_3$, $ZnO$, $ZrO_2$, $Ta_2O_5$, $SnO_2$, and $WO_3$, $CuAlO_2$, $CuGaO_2$, $In_2O_3$, $CdS$, $GaAs$, $InP$, $AlGaAs$, $CdTe$, $Cu_2S$, $CuInSe_2$, and $CuInS_2$. Among the above materials, $TiO_2$ (titanium dioxide), particularly, anatase-type titanium dioxide can be more preferably used in the present invention because of its relatively easily controllable particle size and relatively high flat band potential. By incorporating an adequate amount of rutile titanium dioxide into the above-mentioned semiconductor particles, semiconductor layers having a relatively high light energy conversion efficiency can be made. In this case, the incorporation of rutile titanium dioxide into anatase titanium dioxide for semiconductor particles provides a semiconductor layer having a higher light energy conversion efficiency. The amount of the above rutile titanium dioxide to be incorporated is generally 20% by weight or lower, preferably, 3 to 10% by weight to the total amount of the first- and the second-semiconductor particles. The mean particle size of rutile titanium dioxide is selected from those which do not hinder the property of the semiconductor layer of the present invention, usually, 100±30 nm, preferably, 100±20 nm, and more preferably, 100±10 nm.

To improve the light energy conversion efficiency, a sensitizing dye(s) can be doped onto the semiconductor layer of the present invention, which comprises semiconductor particles having a plurality of peaks in particle size distribution. Any sensitizing dyes can be used without any restriction as long as they can be excited by absorbing lights in visible-, infrared-, and/or ultraviolet-regions. For example, organic dyes and metal complexes can be illustrated. Examples of such organic dyes include polymethine dyes and derivatives thereof: Cyanine dyes such as NK1194, NK3422, NK2426, and NK2501, which are all commercialized by Hayashibara Biochemical Laboratories, Inc., Okayama, Japan; as well as copper phthalocyanine, titanyl phthalocyanine, polychloro copper phthalocyanine, monochloro copper phthalocyanine, poly bromo copper phthalocyanine, cobalt phthalocyanine, nickel phthalocyanine, iron phthalocyanine, tin phthalocyanine, C.I. pigment blue 16, cyanine dyes disclosed in Japanese Patent Application No. 81,541/00; phthalocyanine dyes; merocyanine dyes; and naphthalocyanine dyes.

The organic dyes usable in the present invention include xanthene dyes such as uranin, eosin, rose bengal, rhodamine B, rhodamine 123, rhodamine 6G, erythrosine B, dichloro fluorescein, fluorescein, amino pyrogallol, uranin, 4,5,6,7-tertrachloro fluorescein, fluorescein amine I, fluorescein amine II, and dibromofluorescein; triphenylmethane dyes and derivatives thereof such as malachite green and crystal violet; and coumarins, cumarin-skeleton-containing-compounds, and derivatives thereof such as pyrene, methylene blue, thionine, coumarin 343, and 4-trifluoromethyl-7-dimethylamino coumarin; and others including mordant blue 29, eriochrome cyanine R, aurintricarboxylic acid, naphthochrome greens, and derivatives thereof. In addition to the above-exemplified organic dyes, the following compounds can be used: Inorganic dyes such as carbon black; azo compounds such as C.I. disperse yellow 7, C.I. solvent red 23, C.I. pigment blue 25, C.I. pigment red 41, C.I. acid red 52, C.I. basic red 3, disperse diazo black D, permanent-red 4R, dinitroaniline orange, permanent red GY, permanent carmine BS, disazo yellow, and disazo orange; perinone compounds such as perinone orange; perylene compounds such as perylene scarlet and perylene maroon; quinacridone compounds such as quinacridone red and quinacridone violet; isoindoline compounds such as isoindolinone yellow; dioxazine compounds such as dioxazine violet; quinophthalone compounds such as quinophthalone yellow; compounds such as quinone compounds, quinone imine compounds, squarylium compounds, merocyanine compounds, xanthene compounds, porphyrin compounds, indigo compounds including C.I. vat brown 5 and C.I. vad dies, perylene compounds including argo scarlet B and indanthrene scarlet R, oxazine compounds, diketo pyrrolol compounds, and anthraquinone compounds; and derivatives thereof. Examples of the metal-complex organic dyes include chlorophylls and derivatives thereof; ruthenium bipyridyl complexes such as ruthenium-tris-(2,2'-bispyridyl-4,4'-dicarboxylate), ruthenium-cis-dithiocyano-bis(2,2'-bipyridyl-4,4'-dicarboxylate), ruthenium-cis-diaqua-bis(2,2'-bipyridyl-4,4'-dicarboxylate), a ruthenium-cyano-tris(2,2'-bipyridyl-4,4'-dicarboxylate), cis-(SCN-)-bis(2,2'-bipyridyl-4,4'-dicarboxylate) ruthenium, ruthenium-cis-dicyano-bis(2,2'-bipyridyl-4,4'-dicarboxylate), and ruthenium (II) (4,4'-dicarboxy-2,2'-bipyridyl)2(SCN)2; fluorescent-whitening compounds such as 1,2-bis (benzooxazolyl)ethylene derivatives and 4-methoxy-N-methyl naphthal acid imide; rhodanine derivatives such as 3-ethyl-5-[4-(3-ethyl-2-benzothiazolidene)-2-hexenylidene] rhodanine; 4-(dicyano methylene)-2-methyl-6-(p-dimethylamino-styryl)-4H-pyran; and complexes containing iron or zinc such zinc-tetra(4-carboxyphenyl)porphyrin, iron-hexa cyanide complex, and hemin. Among these sensitizing dyes, cyanine dyes and ruthenium (II) (4,4'-dicarboxy-2,2'-bipyridyl)2(SCN)2 can be preferably used. These sensitizing dyes can be used alone or in combination with two or more of them.

Figure 2:
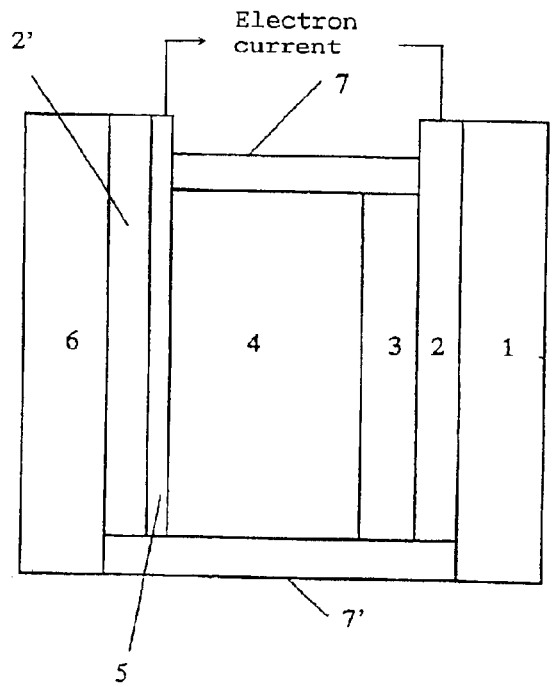
FIG. 2 is a brief drawing of a preferred embodiment of solar cell according to the present invention

FIGS. 1 and 2 outline the semiconductor layer, solar cell using the same, and the production methods thereof according to the present invention. With reference to FIGS. 1 and 2, the semiconductor layer and the solar cell of the present invention are described in detail.

As shown in FIG. 1, an insulating substrate, which functions as the frame of a solar cell and protects a semiconductor layer from unfavorable influences by moisture, oxygen, etc., is provided. The insulating substrate should not be restricted to be made of specific materials, as long as it has the desired electric insulation and adequate strength as a substrate. A transparent electrically conductive film is formed in a usual manner on either side of the front and the back faces of the insulating substrate. Subsequently, the semiconductor layer used in the present invention, which comprises the semiconductor particles having a plurality of peaks in particle size distribution, is added to an acid solvent or an aqueous acid solution of one or more acids selected from nitric acid, nitrous acid, hydrochloric acid, acetic acid, sulfuric acid, and citric acid to make into a suspension, usually, having a concentration of about 1–70% by weight, preferably, about 3–50% by weight, and more preferably about 5–30% by weight. In this case, the pH of the suspension is adjusted to a pH of 2 or lower, preferably, a pH of 1 or lower. The pHs exceeding 2 are unfavorable because they may induce the coagulation of semiconductor particles or induce the deformation of crystalline form of semiconductor particles. To the above suspension the following one or more compounds can be appropriately added: Binders such as cellulosic adhesives such as hydroxy-propyl cellulose; alkyd adhesives, acrylic esters, poly(acrylic)acids, polyamides, polystyrenes, synthetic rubbers, polyethyleneglycols, polyvinyl pyrrolidones, polyvinyl alcohols, urea resins, melamine resins, phenol resins, resorcinol resins, furan resins, epoxy resins, unsaturated polyester resin, anionic surfactants, cationic surfactants, non-ionic surfactants, and amphoteric surfactants. These binders are to increase the viscosity of suspensions (colloidal solutions) of semiconductor particles and to enable the homogeneous uniformity, continuity, and densification of post-dried semiconductor layers. Although it may vary depending on the type of binders used, the concentration thereof is usually 1–99% by weight, more preferably, 20–40% by weight to the total amount of semiconductor particles. Among the above binders, polyethyleneglycols are particularly desirable, and in general, those with a molecular weight of 100–100,000, preferably, 500–50,000, and more preferably, 10,000–30,000, can be used suitably.

Then, after stirring of a suspension containing the semiconductor particles, which have a plurality of peaks in particle size distribution, according to the present invention, the resulting suspension is coated on the surface of an insulated substrate provided with a transparent electrically conductive film to give a thickness of 0.1–1,000 μm, preferably, 1–500 μm, more preferably, 1–300 μm, and more preferably, 1–100 μm. As for the coating method, conventional methods such as dipping, spinner, spraying, rollcoater, screen printing, flexographic printing, gravure, blade coating, bar coating, and CVD methods can be appropriately employed. Thereafter, the resulting coated layer is dried, baked according to conventional method to form a porous thin-film, and cooled to ambient temperature to obtain a semiconductor layer. The semiconductor layer thus obtained generally has a thickness of 0.01–1,000 μm. A sensitizing dye is then adhered or doped onto the semiconductor layer, where the aforesaid coating method can be used as the method for doping such a sensitizing dye on the semiconductor layer. In this case, the sensitizing dye is used in a pre-dissolved form in an appropriate solvent or in a supersaturated form. Any solvents can be used without specific restriction as long as the sensitizing dyes dissolve therein. For example, one or more of the following solvents or mixtures thereof can be used: Alcohols such as methanol, ethanol, 2-methoxy ethanol, 2-ethoxyethanol, 1-propanol, 2-propanol, isopropanol, 2,2,2-trifluoro ethanol, 1-butanol, 2-butanol, isobutyl alcohol, isopentyl alcohol, and benzyl alcohol; organic compounds such as methyl cellosolve, ethyl cellosolve, cyclohexanol, acetone, acetonitrile, anisole, pyridine, phenol, benzene, nitrobenzene, chlorobenzene, toluene, naphthalene, formamide, N-methyl formamide, N,N-Dimethylformamide, hexamethylphosphoamides, dimethyl sulfoxide, sulfolane, cresol, ether, diethyl ether, diphenyl ether, 1,2-dimethoxyethane, chloroform, dichloromethane, 1,2-dichloroethane, 1,4-dioxane, N-methyl pyrrolidone, tetrahydrofuran, hexane, cyclohexane, carbon tetrachloride, formic acid, acetic acid, acetican hydride, trichloroacetic acid, trifluoroacetic acid, ethyl acetate, butyl acetate, ethylene carbonate, propylene carbonate, formamide, nitrile, nitro compound, amine, and sulfur compounds; and glycols such as ethylene glycol and propylene glycol. The aforesaid solvents and mixtures are preferably dehydrated before use. The amount of a sensitizing dye(s) used is 10 μg or more, preferably, 50 μg or more, and more preferably, 70 μg or more per one square centimeter as a specific surface of a semiconductor layer. There is no upper limit of the amount of the sensitizing dye(s) used; it should be considered from an economic viewpoint.

The semiconductor layer thus obtained is then passivated. This treatment is to prevent an electrolyte from its penetrating into the semiconductor layer and then contacting with a transparent electrode formed on an insulating substrate. As long as the object will be attained, such a treatment should not be restricted to a specific one, and usually the passivation is effected by dropping, spraying, doping, adsorbing, or applying a passive agent on the semiconductor layer. Examples of the passive agent include pyridine compounds such as 4-tetra-butylpyridine, dyes having a carboxyl group or a functional group which binds to titanium atom, or the part of a ligand of a metal-complex sensitizing dye represented by Chemical Formula 1. In the case of using such a ligand, it absorbs a visible light in itself and functions as a sensitizer as a merit. Chemical Formula 1:

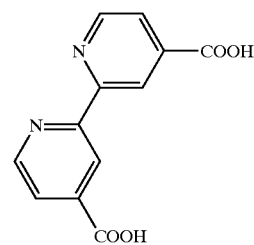

If necessary, to lower the internal resistance of the contact parts of the semiconductor particles in a semiconductor layer, for example, when a semiconductor layer comprises $TiO_2$ particles, $TiCl_4$ is dropped into cold or hot water to form TiOH, then the semiconductor layer is soaked in the suspension for a necking treatment. This treatment is appropriately conducted depending on the type of semiconductor particles used.

Apart from the semiconductor layer as an anode thus prepared, a platinum electrode as a cathode is prepared by applying a transparent conductive film and platinum on an insulating substrate consisting an insulating material(s), for example, a glass substrate. Materials of the cathode are not restricted as long as they make the cathode conductive. The anode and the cathode are then fixed by sealing with a sealant. As the sealant, conventionally used polyethylene sheets, epoxy resins, and fluorine-containing resins can be used suitably. The gap between the anode and the cathode is usually set to about 10–1,000 µm, preferably, about 50–500 µm. Finally, an electrolyte is injected into the space, formed/surrounded by the electrodes and the sealant, to obtain the solar cell of the present invention. Any conventionally used electrolytes can be used without restriction; mixtures of one or more electrochemically active salts and one or more compounds which form a redox system can be used. Examples of the electrochemically active salts include quaternary ammonium salts such as tetra-n-propyl ammonium iodide. Examples of the above compounds which form a redox system include quinone, hydroquinone, iodine, potassium iodide, bromine, and potassium bromide.

The semiconductor layer and the solar cell of the present invention thus obtained are in FIG. 2. In FIG. 2, 1 and 6 show a glass substrate; 2 and 2', a transparent electrode; 3, a semiconductor layer; 4, an electrolyte; 5, a platinum electrode; and 7 and 7', a sealant.

As evident from Example 1 as mentioned later, the solar cell of the present invention thus obtained can achieve a light energy conversion efficiency of over 5% higher than those of conventional ones. According to the present invention, it can be provided solar cells capable of attaining a light energy conversion efficiency of 10% or higher in terms of absolute value when compared with conventional ones which have a semiconductor layer consisting of semiconductor particles having a single peak in particle size distribution.

Therefore, the semiconductor layer and the solar cell of the present invention can be suitably installed in solar cells as an electric-power generator, appliances with solar cells, and the others which need electric power. Examples of these apparatuses include building materials such as roofing tiles, window glasses, blinds, luminaires for gardens, and outer walls; electric appliances which need electric power such as calculators, stationeries, watches, radios, televisions, personal computers, personal-computer peripheral devices, video appliances, audio appliances, game appliances, washing machines, microwave ovens, cleaners, humidifiers, rice cookers, electric stands, apparatuses for air-conditioning and ventilating, and interior or exterior illumination devices; another products including mobile telephones, communication appliances, musical instruments, precision equipments and machineries, street lights, and toys; and others including displays and signs such as road signs, guide lamps, buoys, and lighthouses, as well as electrically powered equipments/machineries and power appliances/machineries such as tools for carpenters and plasterers, electric wheelchairs, bicycles, motor vehicles, heavy machines, vessels, radars, aeroplanes, satellites, spacecrafts, space stations, electricity-generation equipments including solar generators, electric-power supply apparatuses, and solar-heat use systems, etc. The solar cell of the present invention efficiently provides continuous or intermittent powers generated by combining with conventional battery means, AC/DC converters, voltage-controlled means, or electricity controlled means, which include, for example, electric double layer capacitors, lead storage batteries, nickel-cadmium storage batteries, nickel hydrogen storage batteries, lithium ion storage batteries, lithium storage batteries, silver-oxide/zinc storage batteries, nickel/zinc storage batteries, polymer storage batteries, and superconductive flywheel storage batteries. To improve the conversion efficiency of the solar light by the solar cell of the present invention, means to track the motion of the sunlight during the daytime can also be provided, if necessary. The solar cell of the present invention can also use artificial lights such as interior/exterior illuminations in addition to the solar light.

The following Experimental Example and Examples describe in detail the semiconductor layers and the solar cells of the present invention:

EXPERIMENTAL EXAMPLE

Influence of the Mean Particle Size of Semiconductor Particles on the Light Energy Conversion Efficiency Using, as a glass substrate or an insulating substrate, the glass substrate (F dope: NJFL4S-G and F non-dope: CS-4S 230-P110B-F-P60) with an electrically conductive film produced by Nippon Sheet Glass Co., Ltd., Tokyo, Japan, a tin-dioxide membrane was formed on the glass substrate by the spray pyrolysis method. The resulting glass substrate was then doped with fluorine to lower the resistance value and to obtain a transparent electrode. While, as semiconductor particles for forming a semiconductor layer as an anode, anatase-type titanium dioxides, commercialized or prepared with commercialized materials, which had a mean particle size of 5–100 nm (5, 8, 9, 10, 12, 15, 17, 19, 21, 23, 25, 27, 40, 50, 70, and 100 nm) and a single peak (single normal distribution), where about 95% or more of each of which was within the range of ±15% of the above respective mean-particle-sizes, were respectively suspended in an aqueous hydrochloric acid solution (pH 1) in a colloidal form to give a concentration of 10% by weight. Poly (ethylene glycol) (MW 20,000) as a binder, which had been dissolved in an aqueous hydrochloric acid solution (pH 1), was added to the respective suspensions thus obtained to give a concentration of 10% by weight to the semiconductor particles in each suspension, followed by mixing. The bar coating of the resulting suspensions was applied unto the above glass substrate to give about 100 µm in wet film thickness. After air drying, the dried glass substrate was heated from ambient temperature to 450° C. at a temperature-increase-rate of 20.5° C./min under the normal atmospheric pressure using a vacuum firing furnace (KDF-75 commercialized by Denken Co. Ltd., Kyoto, Japan), then baked at 450° C. for 30 min and allowed to stand in the furnace until the inner temperature decreased to ambient temperature. Thereafter, an excessive amount of ruthenium (II) (4,4'-dicarboxy-2,2'-bipyridyl)2(SCN)2 as a sensitizing dye was added to special-grade-chemical methanol to make into a supersaturated solution. Using the supersaturated solution, a sensitizing dye was doped on the above baked glass substrate by the dipping method. After removal of the remaining methanol by air-drying, 4-tetra-butyl pyridine was dropped on the semiconductor layer to passivate it to prepare an anode. While, similarly as in the above, a glass substrate doped with a transparent electrically conductive film was prepared, followed by depositing platinum on the surface of glass substrate by the electron-beam (EB) vapor deposition method to prepare a cathode. The surfaces of the above anode and cathode, upon which had been provided the transparent electrically conductive films, were allowed to be faced each other, and then a small piece, which had been cut out from a polyethylene sheet, produced by Ube Industries, Ltd., Tokyo, Japan, having 300 µm in thickness, into a "□" form, was placed by compression into the space between the above electrodes, followed by heating at 130° C. for 20 min for sealing to bond. Thereafter, a mixture, as a solvent for electrolyte, prepared by mixing acetonitrile with propylene carbonate in a ratio of 2:8 by volume; and another mixture, as a solute for electrolyte, consisting of 0.46 M tetra-n-propyl ammonium iodide and 0.06 M iodine, were used. The electrolyte thus obtained was injected into the space formed by the above sealing means, anode, and cathode for forming different types of solar cells having the structure of FIG. 2. Then, a 150 W xenon lamp, commercialized by Ushio Inc. Tokyo, Japan, was condensed into a light of about 30 mm (ø) to give a spectrum equivalent to the air mass (AM) 1.5 using a shot KG-5 filter, followed by irradiating the light thus obtained to the above solar cells. The result on the examination of the light energy conversion efficiency of these solar cells is in Table 1.

TABLE 1

| Mean particle size of semiconductor particles (nm) | 5 | 8 | 9 | 10 | 12 | 15 | 17 | 19 |
|---|---|---|---|---|---|---|---|---|
| Light energy conversion efficiency (%) | 3.8 | 4.1 | 4.2 | 4.4 | 4.5 | 4.2 | 4.0 | 4.2 |
| Mean particle size of semiconductor particles (nm) | 21 | 23 | 25 | 27 | 40 | 50 | 70 | 100 |
| Light energy conversion efficiency (%) | 4.7 | 5.0 | 4.8 | 4.2 | 3.6 | 3.0 | 2.4 | 2.0 |

As evident from the result in Table 1, the light energy conversion efficiencies of the solar cells having the semiconductor layers produced with the semiconductor particles having a mean particle size of 9 to 15 nm, and those having a mean particle size of 19 to 27 nm, among the semiconductor particles having a mean particle size of 5 to 100 nm, were remarkably higher than those with the others. Particularly, the solar cells, prepared with semiconductor particles having a mean particle size of 12 nm or 23 nm, gave the maximum light energy conversion efficiency.

EXAMPLE 1

Figure 3:
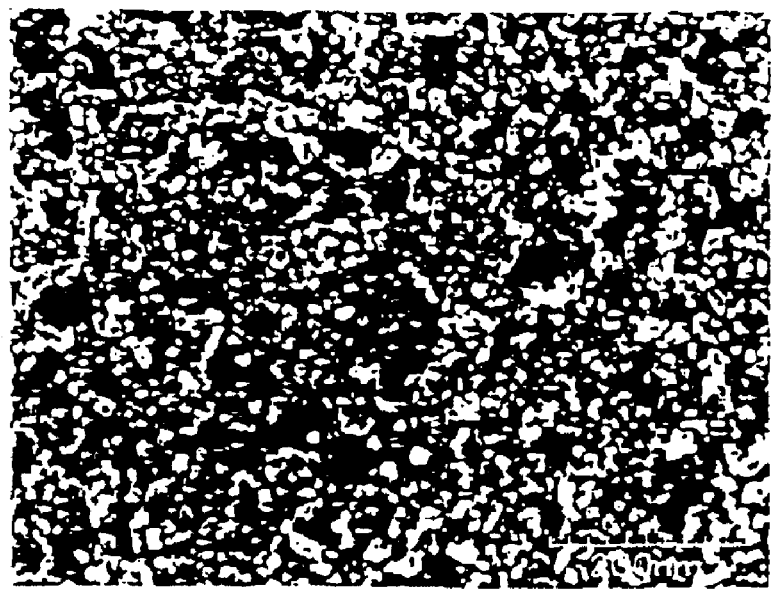
FIG. 3 is a drawing of a photograph of electron microscope of semiconductor particles having a mean particle size of 12 nm.
Figure 3:
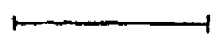
Figure 4:
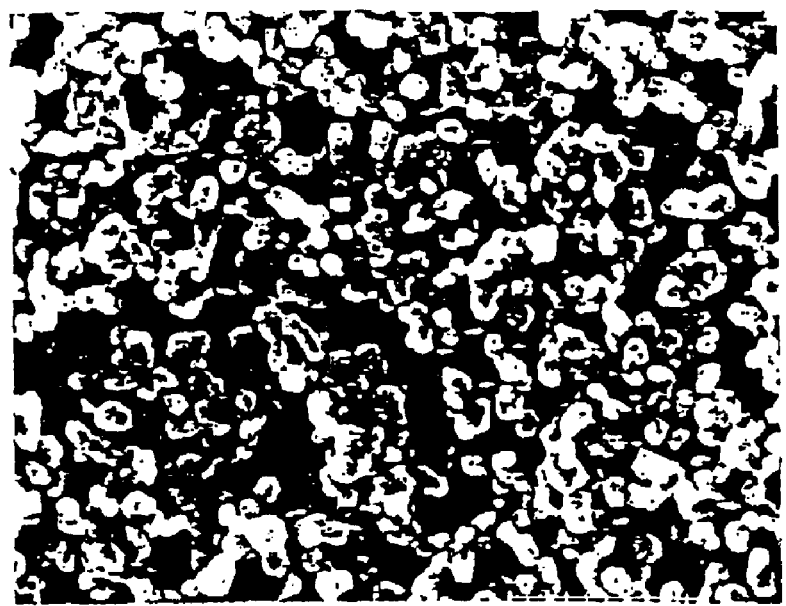
FIG. 4 is a drawing of a photograph of electron microscope of semiconductor particles having a mean particle size of 23 nm.
Figure 4:

Semiconductor layers and solar cells were prepared by the method in the above Experiment Example except for using semiconductor particles prepared by mixing semiconductor particles with mean particle sizes of 12 nm and 23 nm, respectively, in the weight ratios in Table 2. Table 2 shows the light energy conversion efficiencies of the obtained solar cells. FIG. 3 is a figure of an electron micrograph for a semiconductor layer produced with semiconductor particles having a mean particle size of 12 nm, and FIG. 4 is for a semiconductor layer produced with semiconductor particles having a mean particle size of 23 nm.

TABLE 2

| Mean particle size of semiconductor particles (nm) | | Ratio (weight ratio) of semiconductor particles | Light energy conversion efficiency |
|---|---|---|---|
| 12 | 23 | A:B | (%) |
| Content of Semiconductor particles (% by weight) | | | |
| 0 | 100 | — | 5.0 |
| 20 | 80 | 1:4 | 5.4 |
| 40 | 60 | 2:3 | 5.5 |
| 50 | 50 | 1:1 | 5.2 |
| 60 | 40 | 3:2 | 4.6 |
| 80 | 20 | 4:1 | 4.6 |
| 100 | 0 | — | 4.5 |

Note:
The symbol "A" and "B" mean semiconductor particles having mean particle sizes of 12 nm and 23 nm, respectively.

As evident from the result in Table 2, it was revealed that the solar cells, prepared with the semiconductor particles having a mean particle size of 12 nm and those having a mean particle size of 23 nm in a weight ratio of 1:1 to 1:4 showed an outstandingly high light energy conversion efficiency, i.e., a level as high as over five percent.

In Table 2, the solar cell prepared with the semiconductor layer, consisting of semiconductor particles having a mean particle size of 12 nm or 23 nm, was equivalent to a conventional solar cell. When combining the semiconductor particles, having a mean particle size of 9 to 15 nm as the first semiconductor particles, with the semiconductor particles having a mean particle size of 19 to 27 nm as the second semiconductor particles in the above-mentioned ratio as a weight ratio, solar cells with a relatively high light energy conversion efficiency can be obtained.

Also, solar cells with a relatively high light energy conversion efficiency can be obtained by using semiconductor particles having a mean particle size of 5 to 100 nm, where the ratio of the mean particle size of the first semiconductor particles and the second semiconductor particles ((the mean particle size of the first semiconductor particles) <(mean particle size of the second semiconductor particles)) is in the range of about 0.3 to about 0.8 as a ratio of the mean particle size of the first semiconductor particles to that of the second semiconductor particles.

EXAMPLE 2

A semiconductor layer and a solar cell were prepared according to the method in Experiment Example except for using a mixture of semiconductor particles consisting of one part by weight of each of anatase-type titanium dioxides having mean particle sizes of 10 nm and 20 nm as semiconductor particles, and 0.1 part by weight of a rutile titanium dioxide having a mean particle size of 100 nm. The solar cell thus obtained had a light energy conversion efficiency of 5.6%.

The obtained semiconductor layer and the solar cell according to the present invention can be installed as an electric-power generator in solar cells, appliances with solar cells, and others which need electric power: Construction materials such as roofing tiles, window glasses, blinds, luminaires for gardens, and outer walls; electric appliances such as calculators, stationeries, watches/clocks, radios, televisions, personal computers, personal-computer peripheral devices, videos, audio appliances, game appliances, washing machines, microwave ovens, cleaners, humidifiers, rice cookers, electric stands, air-conditioning/ventilating appliances, and interior/exterior illumination devices; mobile telephones; communication appliances; musical instruments; precision equipment/machines; street lights; toys; displays and labels such as road signs, guide lamps, buoys, and lighthouses; electrically-powered-equipments/ machineries and power apparatuses/machineries such as tools for carpenters and plasterers, electric wheelchairs, bicycles, motor vehicles, heavy machines, vessels, radars, aeroplanes, satellites, spacecrafts, and space stations; and others such as electricity-generation equipments including solar generators, electric-power supply apparatuses, and solar thermal conversion systems. In the solar cell of the present invention can be installed an electrical-storage means for electrically storing the generated electricity; or AC/DC converters, voltage-controlled means, or electric-current control means for supplying the electricity stored electrically to the above-mentioned equipments, machineries, and apparatuses. To increase the conversion efficiency of the solar light by the solar cell of the present invention, means to track the motion of the sunlight during the daytime can also be provided.

Possibility of Industrial Applicability

As described above, the present invention is to provide a novel semiconductor layer, solar cell using the same, and production methods and uses thereof. The semiconductor layer and the solar cell of the present invention have a remarkably higher light energy conversion efficiency than those of conventional ones, sufficiently fulfil the need in this art, and well correspond to the need of clean energy and ecology now being popular; they can be used in solar cells as an electric-power generator, appliances with solar cells, and other apparatuses which need electric power. Examples of such, to which the semiconductor layer and the solar cell of the present invention can be widely applicable, include construction materials such as roofing tiles, window glasses, blinds, luminaires for gardens, and outer walls; electric appliances such as calculators, stationeries, watches/clocks, radios, televisions, personal computers, personal-computer peripheral devices, videos, audio apparatuses, game apparatuses, washing machines, microwave ovens, cleaners, humidifiers, rice cookers, electric stands, air-conditioning/ventilating apparatuses, and interior/exterior illumination devices; mobile telephones; communication apparatuses; musical instruments; precision equipment/machines; street lights; toys; displays and labels such as road signs, guide lamps, buoys, and lighthouses; electrically-powered-equipments/machineries and power apparatuses/machineries such as tools for carpenters and plasterers, electric wheelchairs, bicycles, motor vehicles, heavy machines, vessels, radars, aeroplanes, satellites, spacecrafts, and space stations; and others such as electricity-generation equipments including solar generators, electric-power supply apparatuses, and solar thermal conversion systems.

Thus the present invention will greatly influence on this art.

What is claimed is:

1. A semiconductor layer for solar cell, which comprises (a) semiconductor particle groups having a plurality of peaks in particle size distribution, said semiconductor particle groups comprising at least a first semiconductor particle group having a mean particle size of 12±3 nm, and a second semiconductor particle, group having a mean particle size of 23±4 nm in a weight ratio of the first semiconductor particle group to the second semiconductor particle group of 1:1 to 1:4; and (b) a binder.

2. The semiconductor layer of claim 1, wherein the ratio is 2:3.

3. The semiconductor layer of claim 1, wherein said semiconductor particle groups are composed of an anatase-titanium dioxide.

4. The semiconductor layer of claim 3, which further contains rutile titanium dioxide as semiconductor particles.

5. The semiconductor layer of claim 4, wherein said rutile titanium dioxide has a mean particle size of 100±20 nm.

6. The semiconductor layer of claim 4, wherein said rutile titanium dioxide is incorporated in an amount of 20% by weight or lower to the total amount of the first- and the second-semiconductor particle groups.

7. The semiconductor layer of claim 1, which further contains a sensitizing dye.

8. The semiconductor layer of claim 7, wherein said binder is incorporated in an amount of 1–99% by weight to the total amount of the semiconductor particles.

9. In a solar cell comprising a semiconductor layer, the improvement wherein said solar cell comprises the semiconductor layer of claim 1.

10. The solar cell of claim 9, which has a battery means and/or an AC/DC converter.

11. The solar cell of claim 9, which has a light energy conversion efficiency of over five percent.

12. The solar cell of claim 10, which has a means to track the motion of the sunlight during the daytime.

13. A process for producing the semiconductor layer of claim 1, which comprises a step of baking a colloidal solution comprising the semiconductor particle groups and the binder.

14. In a process for producing a solar cell comprising a semiconductor layer, the improvement wherein said semiconductor layer is the semiconductor layer of claim 1.

15. An electric-power supply apparatus, which comprises the solar cell of claim 10 as an electric-power supplying means.

* * * * *